(12) United States Patent
Nishiyama et al.

(10) Patent No.: US 7,729,402 B2
(45) Date of Patent: Jun. 1, 2010

(54) SEMICONDUCTOR LASER ASSEMBLY

(75) Inventors: Nobuhiro Nishiyama, Habikino (JP);
Kenichi Kurita, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 1518 days.

(21) Appl. No.: 10/695,001

(22) Filed: Oct. 29, 2003

(65) Prior Publication Data
US 2004/0091006 A1 May 13, 2004

(30) Foreign Application Priority Data
Oct. 29, 2002 (JP) .............................. 2002-313970

(51) Int. Cl.
*H01S 5/00* (2006.01)
(52) U.S. Cl. ........................ 372/50.1; 372/87
(58) Field of Classification Search .............. 372/50.21, 372/38.05, 36, 43.01, 50.1
See application file for complete search history.

(56) References Cited

U.S. PATENT DOCUMENTS

| 4,567,598 | A | * | 1/1986 | Noguchi et al. ................ 372/36 |
| 4,818,099 | A | * | 4/1989 | Preikschat et al. .......... 356/5.05 |
| 5,359,619 | A | * | 10/1994 | Yoshida et al. .............. 372/50.1 |
| 5,727,009 | A | * | 3/1998 | Tajiri et al. ................ 372/50.11 |
| 5,838,703 | A | * | 11/1998 | Lebby et al. .............. 372/50.21 |
| 5,878,069 | A | * | 3/1999 | Kamibayashi et al. ........ 372/36 |
| 6,115,398 | A | * | 9/2000 | Jiang ........................ 372/50.21 |
| 6,185,239 | B1 | * | 2/2001 | Ijuin et al. ................ 372/50.21 |
| 6,456,635 | B1 | * | 9/2002 | Shiomoto et al. ............. 372/36 |
| 6,574,254 | B1 | * | 6/2003 | Wang ........................... 372/34 |
| 2003/0210718 | A1 | * | 11/2003 | Deacon ....................... 372/36 |

FOREIGN PATENT DOCUMENTS

| JP | 62-130585 | 6/1987 |
| JP | 3-120884 | 5/1991 |
| JP | 5-183239 | 7/1993 |
| JP | 06-053597 | 2/1994 |
| JP | 2001-250254 | 9/2001 |
| JP | 2001-345507 | 12/2001 |
| JP | 2002-176222 | 6/2002 |
| JP | 2002-280674 | 9/2002 |

* cited by examiner

*Primary Examiner*—Minsun Harvey
*Assistant Examiner*—Tuan N. Nguyen
(74) *Attorney, Agent, or Firm*—Morrison & Foerster LLP

(57) ABSTRACT

A semiconductor laser assembly includes a substrate 10 having a first mount surface 10a and a second mount surface 10b, and a submount 3 which is mounted on the first mount surface 10a and which is separate from a monitoring photodiode 4. A laser diode 1 is mounted on the submount 3. The monitoring photodiode 4 is mounted on the second mount surface 10b, and an electrode 4a formed on the monitoring photodiode 4 is used as a relay electrode for a metal wire 5a connected to an upper-surface electrode of the laser diode 1.

14 Claims, 6 Drawing Sheets

SEMICONDUCTOR LASER ASSEMBLY

BACKGROUND OF THE INVENTION

This invention relates to a semiconductor laser assembly.

There has hitherto been a semiconductor laser assembly in which a monitor submount scheme is adopted. FIG. 6A is a view showing a state in which a semiconductor laser assembly is seen from above, and FIG. 6B shows a state in which the semiconductor laser assembly is seen sideways. In FIG. 6B, metal wires are omitted. In this semiconductor laser assembly, a Si (silicon) substrate 110 is mounted on a lead frame substrate 109. An electrode 107 for fitting a laser diode is formed on the Si substrate 110. A laser diode 101 is fitted on the electrode 107. A lower-surface electrode (not shown) of the laser diode 101 is connected to the electrode 107, and a metal wire 105b is connected to the electrode 107. A metal wire 105a is connected to an upper-surface electrode (not shown) of the laser diode 101. The Si substrate is formed with a light-receiving portion 106 adjacent to the laser diode 101, and a metal wire 105c is connected to an electrode 111 formed on an upper surface of the light-receiving portion 106.

There is another conventional semiconductor laser assembly as shown in FIG. 7A and FIG. 7B (e.g., see JP-2001-345507A). FIG. 7A shows a state in which the semiconductor laser assembly is seen from above, and FIG. 7B shows a state in which the semiconductor laser assembly is seen sideways. In FIG. 7B, metal wires are omitted. In this semiconductor laser assembly, a submount 203 is mounted on a lead frame substrate 209. Two spaced electrodes 208a and 208b are formed on the submount 203.

A laser diode 201 is mounted on the submount 203 through the electrode 208b. A lower-surface electrode (not shown) of the laser diode 201 is connected to the electrode 208b, and an upper-surface electrode (not shown) of the laser diode 201 is connected to the electrode 208a by a metal wire 205a. The electrode 208a is connected to an upper surface of the lead frame substrate 209 by a metal wire 205c. The electrode 208b is connected to a stem or lead pin (not shown) by a metal wire 205b. The metal wire 205a connected to the upper-surface electrode of the laser diode 201 is extended in a direction approximately perpendicular to an optical axis of the laser diode 201.

A monitoring photodiode 204 is mounted on the lead frame substrate 209, and a light-receiving portion 206 is provided on an upper surface of the photodiode 204. The photodiode 204 is separate from the submount 203, and the thickness Hp of the photodiode 204 is smaller than the thickness Hs of the submount 203 (Hp<Hs), as shown in FIG. 7B.

In this device, the purpose of making the thickness Hp of the photodiode 204 smaller than the thickness Hs of the submount 203 as described above is to make a laser beam from the laser diode 201 incident on the light-receiving portion 206.

In the former conventional device in which the monitor submount method is adopted, the light-receiving portion 106 is formed on the Si substrate 110, which serves as a submount of the laser diode 101.

However, Si (silicon) has a relatively small heat conductivity (84-147 W/m·K) and is not necessarily sufficient for letting out heat generated in the laser diode 101. Thus, there is a problem that it is difficult to adopt a laser diode requiring a lot of heat dissipation.

On the other hand, since the photodiode 204 and the submount 203 are separated from each other in the latter conventional device, a material having higher heat conductivity than Si can be used as the material of the submount 203.

In the latter case, however, if the thickness of the photodiode 204 is larger than that of the submount 203, the amount of laser light that is incident on the light-receiving portion 206 of the photodiode 204 from the laser diode 201 decreases. Consequently, sufficient monitoring cannot be achieved. Therefore, it is required that the thickness of the submount 203 and the thickness of the photodiode 204 be set strictly, which increases restriction on the production process.

In the former case, when the metal wire 105a from the laser diode 101 is connected to the substrate 109, a height difference between the opposite end portions of the metal wire 105a increases and thus workability and reliability in the wire connection is not good.

On the other hand, in the latter conventional case, since the metal wire 205a from the laser diode 201 is relayed via the electrode 208a on the submount 203, a height difference between the opposite end portions of the metal wire 205a can be reduced compared with the former conventional case. However, there is a requirement that an electrode formed on the submount 203 must be divided into an electrode 208a and an electrode 208b. This causes a complication in the production process.

SUMMARY OF THE INVENTION

An object of the present invention is to provide a semiconductor laser assembly which can adopt a high-power laser diode requiring much heat dissipation and which can easily be produced.

In order to accomplish the above object, a semiconductor laser assembly according to the present invention includes:
  a substrate including a first mount surface and a second mount surface;
  a submount mounted on the first mount surface of the substrate;
  a laser diode mounted on the submount and having at least one light emission point and an electrode; and
  a monitoring photodiode mounted on the second mount surface of the substrate and having a light-receiving surface which receives light emitted from the light emission point, and a relay electrode connected to the electrode of the laser diode by a metal wire.

In the semiconductor laser assembly of the present invention, the electrode (relay electrode) formed on the monitoring photodiode is used for the relay of the metal wire connected to the electrode of the laser diode. This dispenses with separated electrodes on the submount, which would conventionally be required, and moreover, compared with the case in which the metal wire from the laser diode is directly connected to the substrate, a height difference between the opposite end portions of the metal wire can be reduced because the metal wire is relayed to another via the electrode on the photodiode. Thus, workability and reliability in the wire connection can be improved.

Therefore, according to the present invention, a submount that is separate from the photodiode is adoptable, so that the heat dissipation characteristic can be improved and a laser diode requiring much heat dissipation can be adopted. Furthermore, workability and reliability in the wire connection is improved and thus a semiconductor laser assembly that is easily producible is provided.

In one embodiment, a height of the first mount surface in a direction normal to an upper surface of the substrate is higher than that of the second mount surface.

In the semiconductor laser assembly of the embodiment, the laser diode is mounted on the submount mounted on the first mount surface, which is higher than the second mount surface on which the monitoring photodiode is mounted. Therefore, even if the thickness of the monitoring photodiode is larger than the thickness of the submount by the degree by which the first mount surface is higher than the second mount surface, the light emission point of the laser diode is not lower than the light-receiving surface of the monitoring photodiode, thus enabling laser beams from the light emission point of the laser diode to impinge on the light-receiving surface of the monitoring photodiode.

Therefore, according to the embodiment, it becomes unnecessary to set the thicknesses of the submount and the photodiode as strictly as done before, so that the production is facilitated. Thus, according to the embodiment, adoption of the submount that is separate from the photodiode improves the heat dissipation characteristic, and a laser diode requiring a lot of heat dissipation can be adopted. Moreover, the semiconductor laser assembly of the embodiment is easily producible.

In one embodiment, as seen from above, the metal wire is disposed approximately consistent with an optical axis of the laser diode.

Thus, laser light emitted from the emission point of the laser diode is reflected on the metal wire to the light-receiving surface of the monitoring photodiode, so that it becomes easier for the laser light to be incident on the light-receiving surface of the monitoring photodiode. Accordingly, increase of the amount of light received by the monitoring photodiode as well as improvement of the monitoring sensitivity is achievable.

In one embodiment, the first and second mount surfaces of the substrate and a laser diode mount surface of the submount are approximately parallel to one another.

Preferably, the laser diode mount surface of the submount may be approximately at the same height as the light-receiving surface of the monitoring photodiode. In this case, the light-receiving surface of the monitoring photodiode is surely lowered than the light emission point of the laser diode. Therefore, light emitted from the light emission point of the laser diode can easily be made incident on the light-receiving surface.

The light-receiving surface of the monitoring photodiode may be at approximately the same height as the light emission point of the laser diode.

In one embodiment, the submount is made of an insulating material having a higher heat conductivity than the monitoring photodiode.

Therefore, a high-power laser diode requiring heat dissipation to a high degree can be adopted.

In one embodiment, the submount has a length in a direction of an optical axis of the laser diode that is approximately equal to a resonator length of the laser diode.

With this constitution, the emission of the laser diode can efficiently be taken out from a main light-emitting surface without being blocked by the submount.

In one embodiment, at least one additional laser diode is mounted on the submount, the additional laser diode also has at least one light emission point and an electrode, and the monitoring photodiode is provided with an additional relay electrode connected to the electrode of the additional laser diode by a metal wire.

In the semiconductor laser assembly of the embodiment, provision of a plurality of laser diodes having different wavelengths is enabled. This makes it possible to meet users' various needs.

In one embodiment, the laser diode has a plurality of light emission points.

In the semiconductor laser assembly of the embodiment, for example, a dual wavelength laser can be adopted as the laser diode, whereby a semiconductor laser assembly that meets users' needs can easily be fabricated.

In one embodiment, two separated metal layers are disposed on the submount, and the laser diode is mounted on the submount through the metal layers in a junction-down manner.

In the semiconductor laser assembly of the embodiment, electric power may be supplied to the laser diode through each of the metal layers, independently of each other. Thus, in the case where the laser diode has two light emission points, for example, lighting of the two light emission points can be controlled independently.

Other objects, features and advantages of the present invention will be apparent from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will hereinafter be described in detail on the basis of embodiments illustrated.

First Embodiment

Figure 1A:
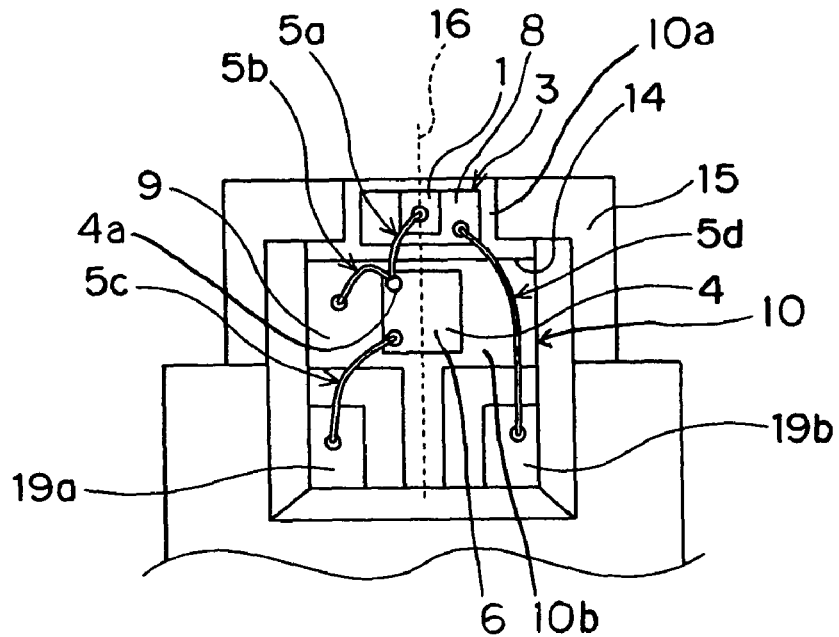
FIG. 1A is a plan view of a first embodiment of a semiconductor laser assembly of the present invention.
Figure 1B:
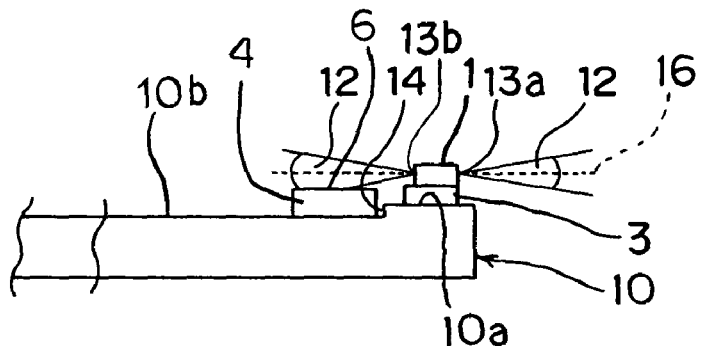
FIG. 1B is a sectional view of the first embodiment.
Figure 1C:
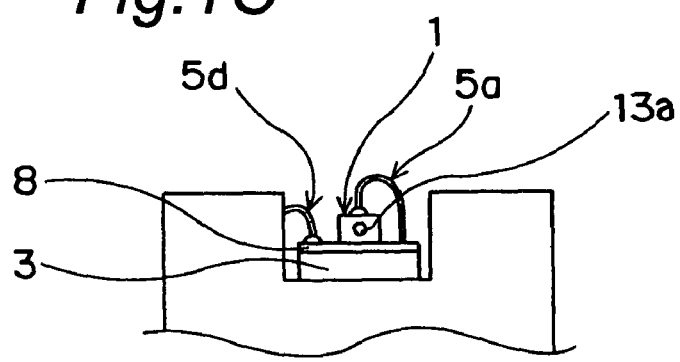
FIG. 1C is a front view of the first embodiment.

A first embodiment of the semiconductor laser assembly of the present invention is shown in FIGS. 1A-1C. FIG. 1A shows a state in which the first embodiment is seen from above to below; FIG. 1B shows a configuration in a section taken by a vertical plane passing an optical axis 16 in FIG. 1A; FIG. 1C shows a state in which a light emission point 13a of a main light-emitting surface of a laser diode in the first embodiment is seen in the direction of the optical axis.

As shown in FIG. 1B, the first embodiment is a lead frame type semiconductor laser assembly. A submount 3 is mounted on a first mount surface 10a of a roughly T-shaped first metal lead 10 as a substrate, and a monitoring photodiode 4 is mounted on a second mount surface 10b of the first metal lead 10. There is a rise 14 on a border between the first mount surface 10a and the second mount surface 10b. The height of the first mount surface 10a in a direction normal to an upper surface 9 of the first metal lead 10 is larger than that of the second mount surface 10b. In the first embodiment, as one example, the rise 14 is formed by rendering processing such as coining upon the first metal lead 10, so that the second mount surface 10b that is more receded than the first mount surface 10a is formed, but the above processing may also be grinding, instead of coining.

As shown in FIG. 1C, the laser diode 1 is mounted on the submount 3 through a metal layer 8. A light-receiving surface 6 of the monitoring photodiode 4 is lower than a light emission point 13b of the laser diode 1. As shown in FIG. 1B, in the first embodiment, the height of the light-receiving surface 6 of the monitoring photodiode 4 is approximately equal to that of a laser diode mount surface 3a of the submount 3.

As shown in FIG. 1A, an upper-surface electrode (not shown) of the laser diode 1 is connected to a relay electrode 4a formed on an upper surface of the monitoring photodiode 4 by a metal wire 5a. Further, the relay electrode 4a is connected to the upper surface 9 of the first metal lead 10 by a metal wire 5b.

A lower-surface electrode (not shown) of the monitoring photodiode 4 is connected to the upper surface 9 of the metal lead 10, and an upper-surface electrode (not shown) of the monitoring photodiode 4 is connected to a second metal lead 19a by a metal wire 5c. On the other hand, the metal layer 8 formed on the submount 3 is connected to another second metal lead 19b by a metal wire 5d. The second metal leads 19a, 19b are formed at a predetermined interval (gap) from the first metal lead 10. In FIG. 1A, reference numeral 15 indicates a resin portion, and reference numeral 16 indicates the optical axis of the laser diode 1.

According to the first embodiment with the above constitution, the electrode 4a formed on the monitoring photodiode 4 serves as the relay electrode for the metal wire 5a connected to the upper-surface electrode of the laser diode 1. This dispenses with separated electrodes on the submount that were required before. Moreover, compared with the case where the metal wire 5a from the laser diode 1 is directly connected to the second mount surface 10b (upper surface 9) of the first metal lead 10, a fall or a level difference between the opposite end portions of the metal wire 5a is reduced by the height of the electrode 4a on the photodiode 4. Therefore, workability and reliability in the wire connection can be improved.

In the semiconductor laser assembly of the embodiment, the laser diode 1 is mounted on the submount 3 mounted on the first mount surface 10a, which is higher than the second mount surface 10b of the first metal lead 10, on which the monitoring photodiode 4 is mounted. Thus, even if the thickness of the monitoring photodiode 4 is larger than that of the submount 3 by the degree by which the first mount surface 10a is higher than the second mount surface 10b, the light emission points 13a, 13b of the laser diode 1 are not positioned below the light-receiving surface 6 of the monitoring photodiode 4, thus making it possible for laser light 12 from the light emission point 13b of the laser diode 1 to be incident on the light-receiving surface 6 of the monitoring photodiode 4.

As one example, in the case where the thickness of the submount 3 is defined as Hs (mm) and the amount of the rise 14 (namely, the coining depth) is defined as Hc (mm), if the thickness Hp (mm) of the monitoring photodiode 4 is set smaller than (Hs+Hc), the height of the light-receiving surface 6 of the monitoring photodiode 4 can surely be lowered than the height of the light emission point 13b of the laser diode 1.

Thus, according to the embodiment, it becomes unnecessary to set the thicknesses of the submount 3 and the photodiode 4 as strictly as conventionally required, which facilitates the production. According to the embodiment, adoption of the submount 3 separate from the photodiode 4 makes it possible to achieve a semiconductor laser assembly that can adopt a laser diode requiring large heat dissipations and that is easy to produce.

The semiconductor laser assembly of the embodiment includes the submount 3 that is separate from the monitoring photodiode 4. The submount 3 is made of an insulating material having a higher heat conductivity than the monitoring photodiode 4, such as, for example, SiC (heat conductivity: 270 W/m·K), or AlN (heat conductivity: 60-260 W/m·K). Thus, a heat dissipation characteristic can be improved, and a high-power laser diode requiring large heat dissipations is adoptable.

Second Embodiment

Figure 2A:
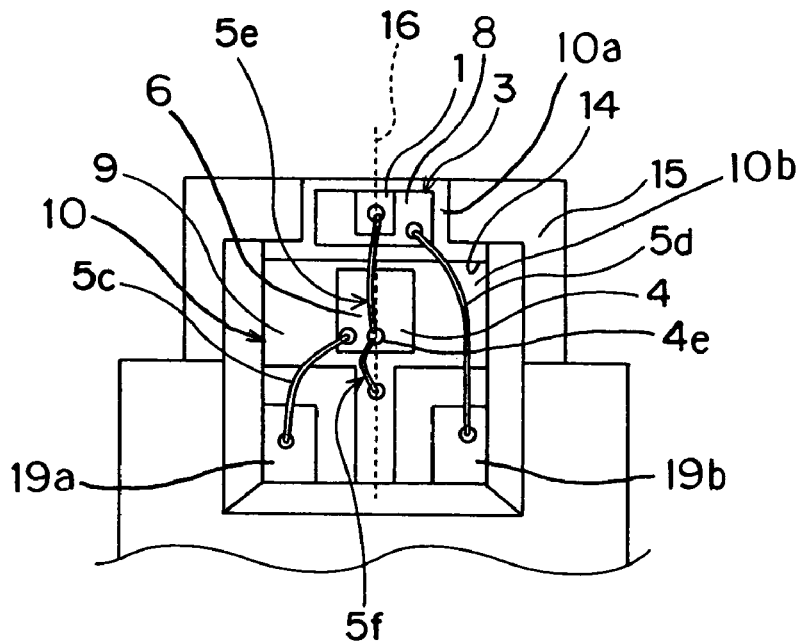
FIG. 2A is a plan view of a second embodiment of the semiconductor laser assembly of the present invention.
Figure 2B:
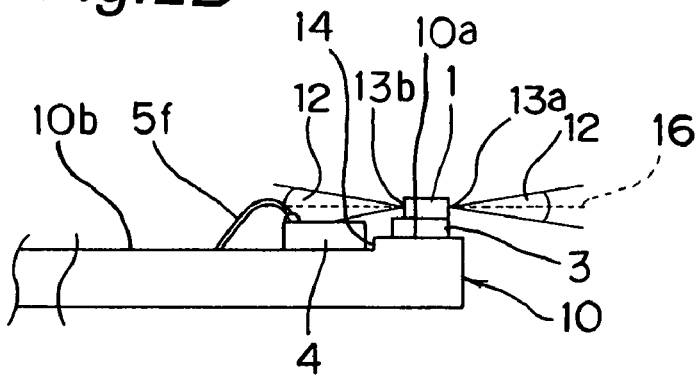
FIG. 2B is a sectional view of the second embodiment.
Figure 2C:
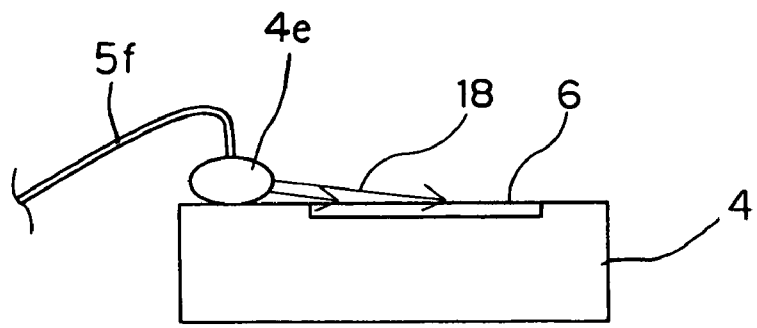
FIG. 2C is a partially enlarged sectional view of the second embodiment.

A second embodiment of the semiconductor laser assembly of the present invention is shown in FIGS. 2A-2C. FIG. 2A shows the second embodiment as seen from above; FIG. 2B shows a configuration in cross section taken along a vertical plane including an optical axis 16 in FIG. 2A; FIG. 2C shows an enlarged view of a monitoring photodiode and its vicinity in FIG. 2A. It should be noted that wires other than a metal wire 5f are omitted from FIG. 2B and FIG. 2C. The second embodiment is different from the above first embodiment only in the following respect.

That is, a metal wire 5e is provided in place of the metal wire 5a. The metal wire 5e is extends from a connection point with the upper-surface electrode of the laser diode 1 approximately along and above the optical axis 16 of the laser diode 1. Further, the metal wire 5e is connected to a relay electrode 4e formed on the monitoring photodiode 4 and placed approximately right under the optical axis 16. The relay electrode 4e is opposed to the laser diode 1 with the light-receiving surface 6 interposed therebetween. The relay electrode 4e is connected to the upper surface 9 of the roughly T-shaped first metal wire 10 by a metal wire 5f.

According to the second embodiment, the metal wire 5e is disposed approximately right above the optical axis 16 of the laser diode 1, namely, the metal wire 5e is approximately consistent with the optical axis 16 of the laser diode 1, when seen from above. Laser light emitted from the laser diode largely spreads out upwards and downwards. Thus, laser light 12 emitted from the light emission point 13b of the laser diode 1 is reflected on the metal wire 5e so that the reflected light is easily incident on the light-receiving surface 6 of the monitoring photodiode 4. Thus, increase of the amount of light received and hence improvement of the monitoring sensitivity are achievable. Further, as shown in FIG. 2C, reflected laser light 18 from the relay electrode 4e on the photodiode 4, to which the metal wire 5f is connected, is advantageously made incident on the light-receiving surface 6, so that the amount of light received can further be increased.

According to the second embodiment, since the metal wire 5e is relayed to another at the relay electrode 4e on the photodiode 4, a height difference between the end portions of the metal wire 5e is reduced, thus making it possible to improve workability and reliability in the wire connection, compared with the case where the metal wire 5e is directly connected to the upper surface 9 of the first metal lead 10.

Third Embodiment

Figure 3A:
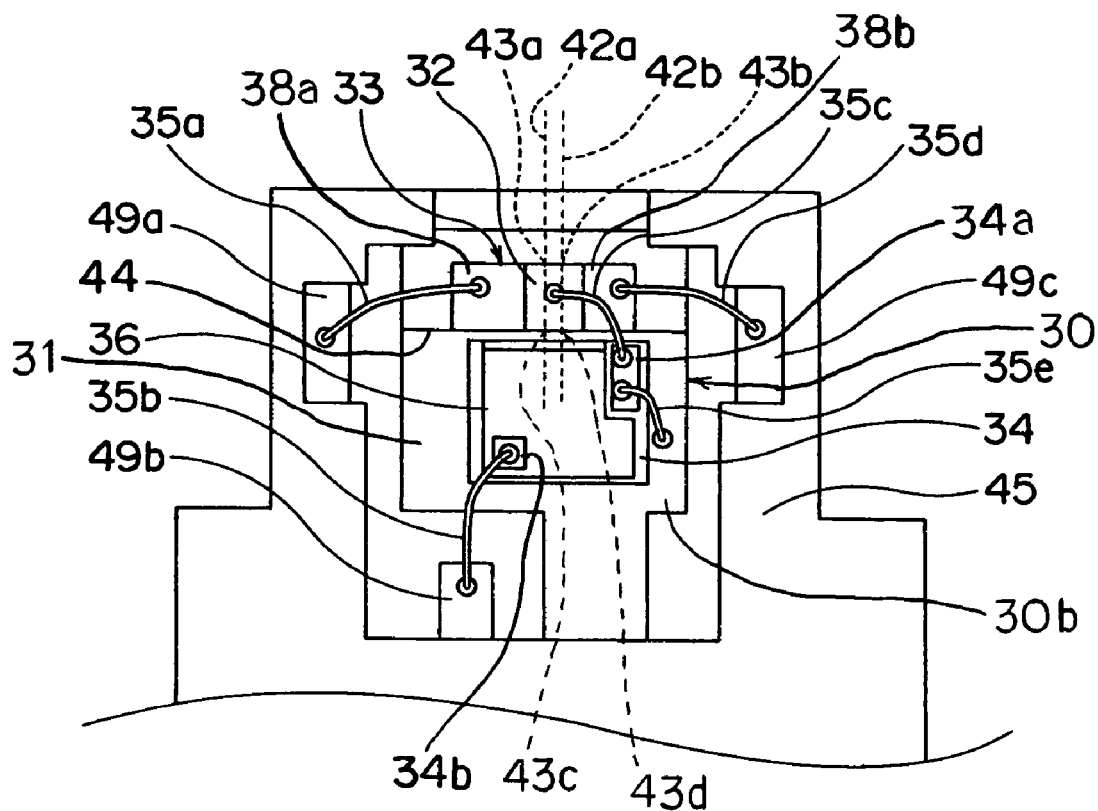
FIG. 3A is a plan view of a third embodiment of the semiconductor laser assembly of the present invention.
Figure 3B:
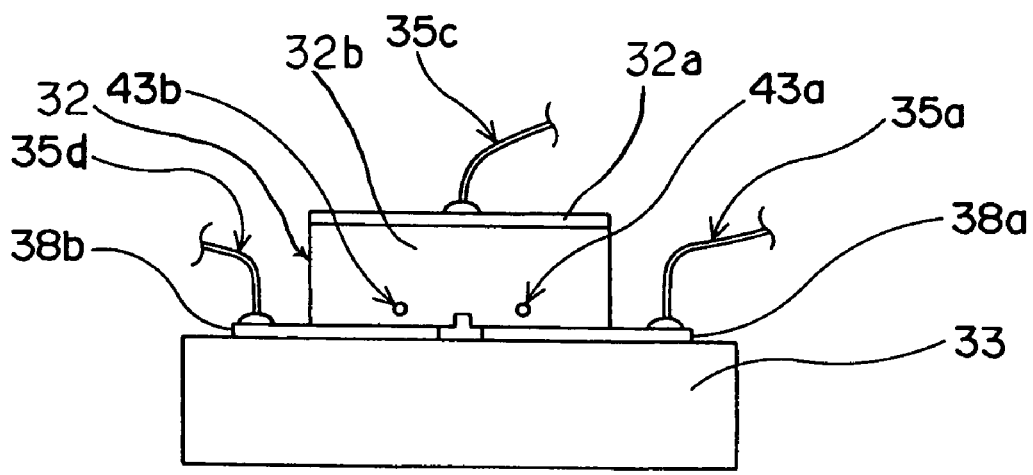
FIG. 3B is a front view of the third embodiment.

Next, a third embodiment of the semiconductor laser assembly of the present invention is shown in FIGS. 3A-3B. FIG. 3A shows the third embodiment as seen from above; and FIG. 3B shows the third embodiment as seen from the side of a main light-emitting surface of a laser diode.

The third embodiment is a lead frame type semiconductor laser assembly, and a submount 33 is mounted on a first mount surface 30a of a first metal lead 30 as a substrate, and a photodiode 34 is mounted on a second mount surface 30b of the first metal lead 30. There is a vertical rise 44 between the first mount surface 30a and the second mount surface 30b. The height of the first mount surface 30a in the direction normal to an upper surface 31 of the first metal lead 30 is larger than that of the second mount surface 30b.

As shown in FIG. 3B, a laser diode 32 is mounted on the submount 33 through a metal layer 38a and a metal layer 38b. The metal layer 38a and the metal layer 38b are separated. A metal wire 35a is connected to the metal layer 38a, and a metal wire 35d is connected to the metal layer 38b. As shown in FIG. 3A, the metal wire 35a is connected to a second metal lead 49a. The metal wire 35d is connected to another second metal lead 49c. The second metal leads 49a and 49c each are a predetermined distance away from the first metal lead 30.

As shown in FIG. 3B, a first light emission point 43a is positioned at a main light-emitting surface 32b on the metal layer 38a, and a second light emission point 43b is positioned at the main light-emitting surface 32b on the metal layer 38b.

As shown in FIG. 3A, an upper-surface electrode 32a of the laser diode 32 is connected to a relay electrode 34a formed on an upper surface of the photodiode 34 by a metal wire 35c. The relay electrode 34a is connected to a metal wire 35e, and the metal wire 35e is connected to the second mount surface 30b of the first metal lead 30.

An upper-surface electrode 34b of the photodiode 34 is connected to a second metal lead 49b at a predetermined distance away from the second mount surface 30b. In FIG. 3A, reference numeral 36 denotes a light-receiving surface of the photodiode 34, and reference numeral 45 denotes a resin portion.

According to the third embodiment, since the laser diode 32 has the two light emission points 43a, 43b, the laser diode 32 may be a dual wavelength laser as, for example, which makes it possible to easily produce a semiconductor laser assembly that meets a user's needs. The laser diode 32 may be provided with three or more light emission points.

In the semiconductor laser assembly of the embodiment, the two separated metal layers 38a, 38b are disposed on the submount 33, and the laser diode 32 is mounted on the submount 33 in a junction-down manner. In the semiconductor laser assembly, electric power can be supplied to the laser diode 32 from the two separate metal layers 38a, 38b independently. This enables independent controlling of the two light emission points 43a, 43b to be lit.

In the semiconductor laser assembly of the embodiment, the submount 33 has a length approximately equal to a resonator length of the laser diode 32 in the direction of optical axes 42a, 42b of the laser diode 32. Thus, light emitted from the laser diode 32 is not blocked by the submount 33, so that the emitted light can efficiently be taken out from the main light-emitting surface 32b.

As in the first embodiment, the electrode 34a formed on the monitoring photodiode 34 is used as a relay electrode for the metal wire 35c connected to the upper-surface electrode 32a of the laser diode 32 in the semiconductor laser assembly of the third embodiment. This dispenses with separated electrodes on the submount, which would conventionally be used for the relay of wires. Moreover, compared with the case where the metal wire 35c from the laser diode 32 is directly connected to the second mount surface 30b of the first metal lead 30, a height difference between the end portions of the metal wire 35c is reduced by the height of the electrode 34a on the photodiode 34. Therefore, workability and reliability in the wire connection can be improved.

As in the first embodiment, in the semiconductor laser assembly of the third embodiment, the laser diode 32 is mounted on the submount 33 mounted on the first mount surface 30a, which is higher than the second mount surface 30b of the first metal lead 30 on which the monitoring photodiode 34 is mounted. Thus, even if the thickness of the monitoring photodiode 34 is larger than that of the submount 33 by the degree by which the first mount surface 30a is higher than the second mount surface 30b, light emission points 43c, 43d of the laser diode 32 are not positioned below the light-receiving surface 36 of the monitoring photodiode 34, thus making it possible for laser light to be incident on the light-receiving surface 36 of the monitoring photodiode 34 from the light emission points 43c, 43d of the laser diode 32.

In the semiconductor laser assembly of the third embodiment, the submount 33 that is separate from the monitoring photodiode 34 is made of an insulating material having a higher heat conductivity than the monitoring photodiode 34, such as, for example, SiC (heat conductivity: 270 W/m·K) or AlN (heat conductivity: 60-260 W/m·K), as in the first embodiment. Thus, the heat dissipation characteristic can be improved, and a high-power laser diode requiring much heat dissipation can be adopted.

Fourth Embodiment

Figure 4A:
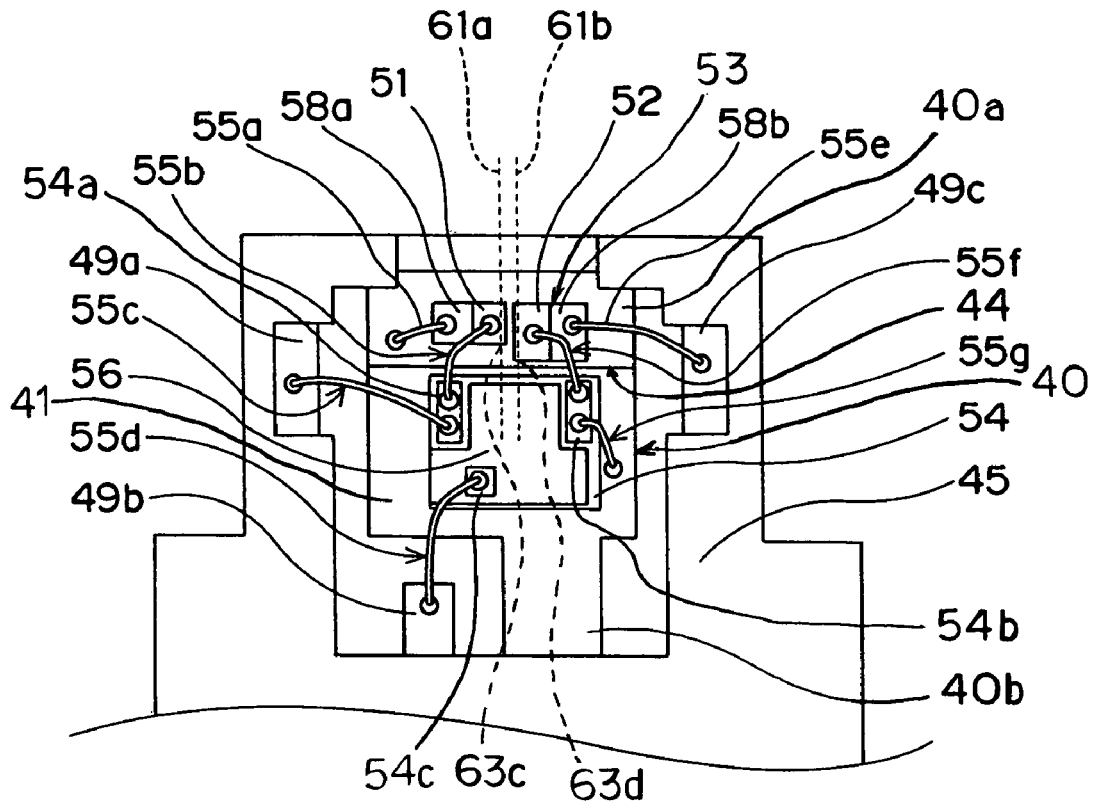
FIG. 4A is a plan view of a fourth embodiment of the semiconductor laser assembly of the present invention.
Figure 4B:
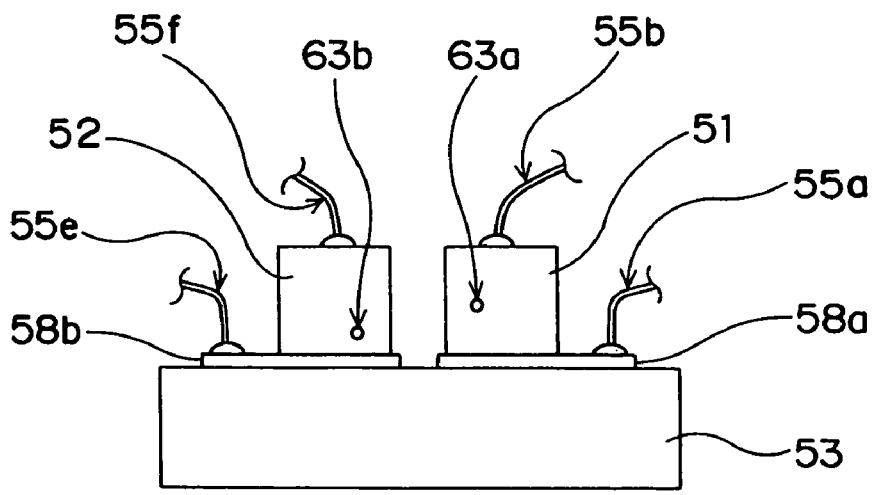
FIG. 4B is a front view of the fourth embodiment.

A fourth embodiment of the semiconductor laser assembly of the present invention is shown in FIGS. 4A-4B. FIG. 4A shows the fourth embodiment as seen from above; and FIG. 4B shows the fourth embodiment as seen from the side of main light-emitting surfaces of laser diodes.

In the fourth embodiment, as shown in FIG. 4B, a first laser diode 51 is mounted on a submount 53 through a metal layer 58a, and a second laser diode 52 is mounted on the submount 53 through a metal layer 58b.

As shown in FIG. 4A, the submount 53 is mounted on a first mount surface 40a of a first metal lead 40 as a substrate, and a photodiode 54 is mounted on a second mount surface 40b of the substrate 40. There is a vertical rise 44 between the first mount surface 40a and the second mount surface 40b. The height of the first mount surface 40a in the direction normal to an upper surface 41 of the first metal lead 40 is larger than that of the second mount surface 40b.

The metal layer 58a is connected to the first mount surface 40a by a metal wire 55a, and the metal layer 58b is connected to a second metal lead 49c by a metal wire 55e. An upper-surface electrode (not shown) of the laser diode 51 is connected to a first relay electrode 54a by a metal wire 55b. The first relay electrode 54a is formed on an upper surface of the photodiode 54. A second relay electrode 54b formed on the upper surface of the photodiode 54 is connected to an upper-surface electrode of the laser diode 52 by a metal wire 55f.

The first relay electrode 54a is connected to a second metal lead 49a by a metal wire 55c. The second metal leads 49a, 49c are each a predetermined distance away from the second mount surface 40b. The second relay electrode 54b is connected to the second mount surface 40b of the first metal lead 40 by a metal wire 55g.

An electrode 54c at an upper-surface of the photodiode 54 is connected to a second metal lead 49b by a metal wire 55d. The second metal lead 49b leaves a predetermined space away from the second mount surface 40b. In FIG. 4A, reference numeral 56 indicates a light-receiving surface of the monitoring photodiode 54, and reference numeral 54 indicates a resin portion.

Since the semiconductor laser assembly of the fourth embodiment is provided with the two laser diodes 51, 52, the two laser diodes 51, 52 may have different wavelengths. For example, the laser diode 51 may be a laser diode having a light emission point 63a for outputting low-power laser light for DVDs (digital versatile discs) and the laser diode 52 may be a laser diode having a light emission point 63b for outputting high-power laser light for CDs (compact discs). This makes it possible to meet users' various needs. Three or more laser diodes may also be mounted on the submount 53.

As in the third embodiment, in the fourth embodiment, the first and second relay electrodes 54a, 54b are used as the relay electrodes for the metal wires 55b, 55f from the laser diodes 51, 52, respectively. This dispenses with separated electrodes on the submount 53 for the relay of wires, and a level difference between the opposite end portions of each metal wire 55b, 55f can be reduced, thus making it possible to improve the workability and reliability in the wire connection.

As in the third embodiment, in the fourth embodiment, the submount 53 is mounted on the first mount surface 40a of the first metal lead 40 as the substrate, and the photodiode 54 is mounted on the second mount surface 40b that is lower than the first mount surface 40a. This facilitates setting the light emission points 63c, 63d of the laser diodes 51, 52 at a level higher than the light-receiving surface 56.

Fifth Embodiment

Figure 5A:
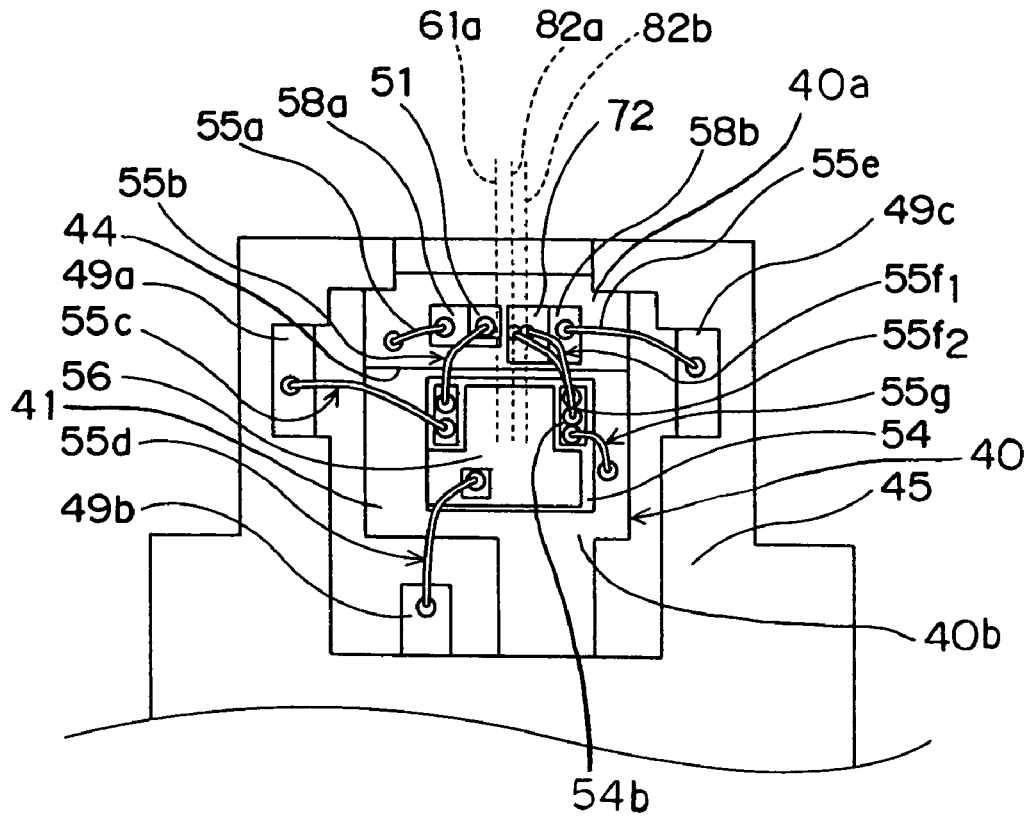
FIG. 5A is a plan view of a fifth embodiment of the semiconductor laser assembly of the present invention.
Figure 5B:
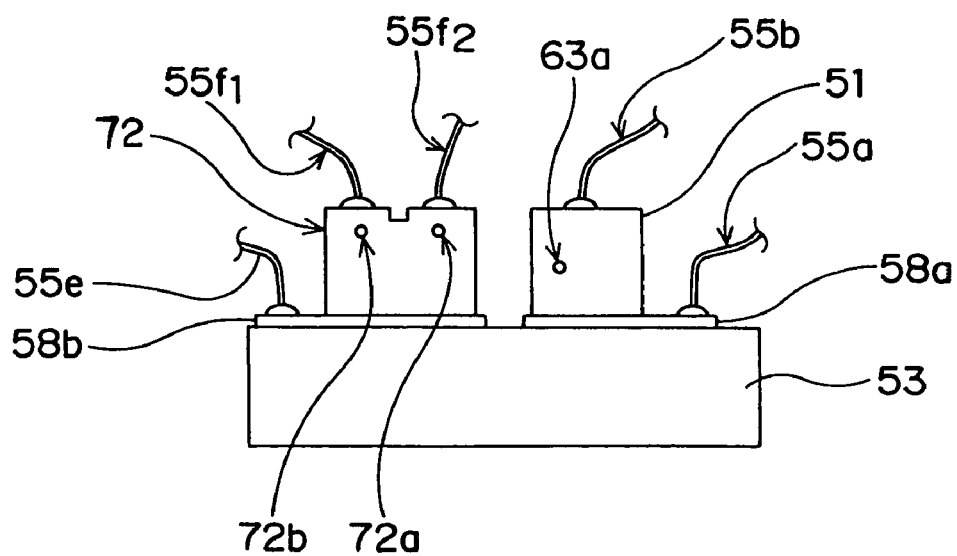
FIG. 5B is a front view of the fifth embodiment.
Figure 6A:
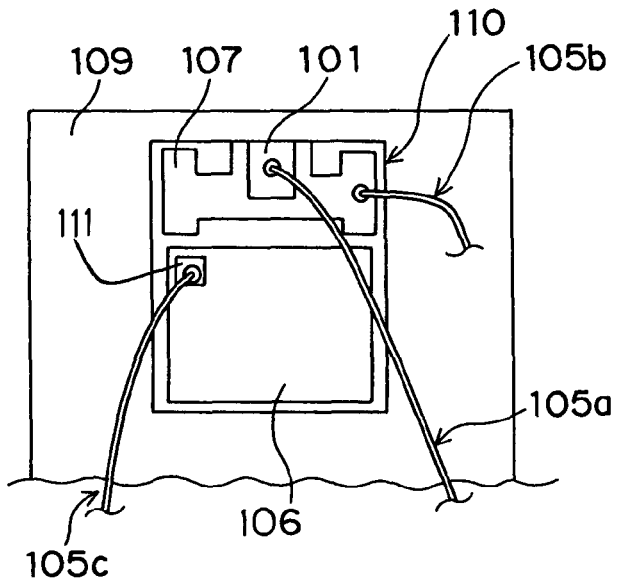
FIG. 6A is a plan view of an example of a conventional semiconductor laser assembly.
Figure 6B:
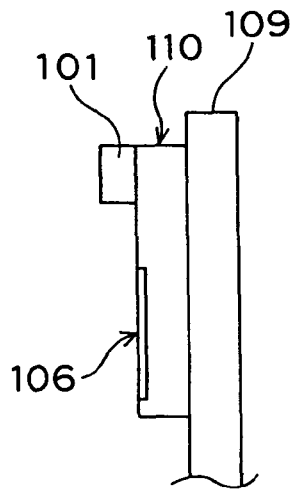
FIG. 6B is a side view of the example.
Figure 7A:
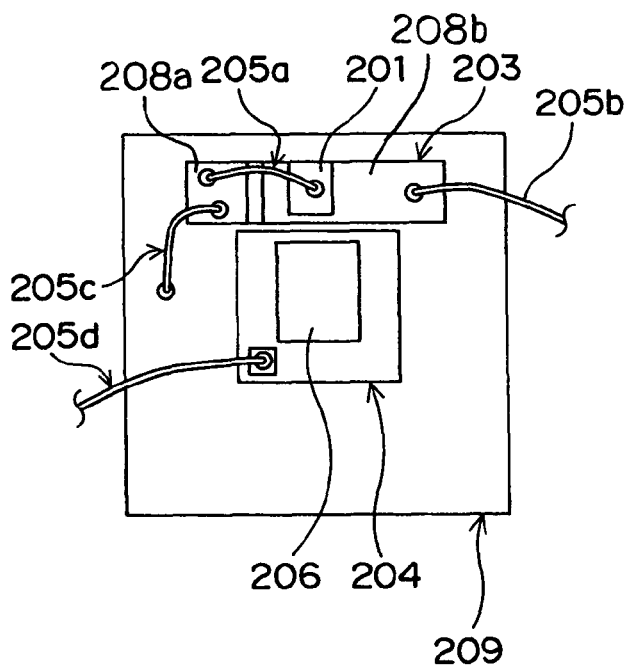
FIG. 7A is a plan view of another example of a conventional semiconductor laser assembly.
Figure 7B:
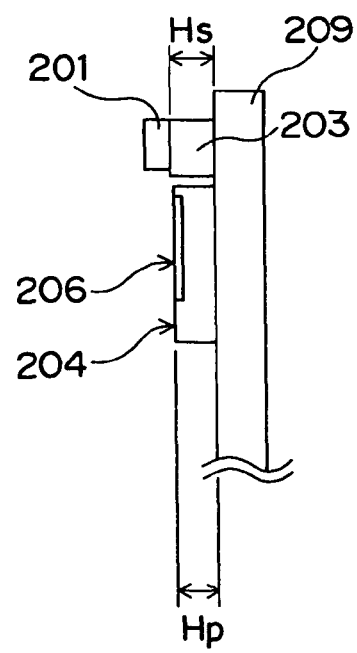
FIG. 7B is a side view of the example.

A fifth embodiment of the semiconductor laser assembly of the present invention is shown in FIGS. 5A and 5B. FIG. 5A shows the fifth embodiment as seen from above; and FIG. 5B shows the fifth embodiment as seen from the side of main light-emitting surfaces of laser diodes.

As shown in FIG. 5B, the fifth embodiment is the same as the fourth embodiment in that the first laser diode 51 is mounted on the submount 53 through the metal layer 58a, but different from the fourth embodiment in that a second laser diode 72 is mounted on the submount 53 through the metal layer 58b. In the fifth embodiment, differences from the fourth embodiment will mainly be described.

As shown in FIG. 5A, the submount 53 is mounted on the first mount surface 40a of the first metal lead 40 as a substrate, and the photodiode 54 is mounted on the second mount surface 40b of the first metal lead 40. There is a vertical rise 44 between the first mount surface 40a and the second mount surface 40b. The height of the first mount surface 40a in the direction normal to the upper surface 41 of the first metal lead 40 is larger than that of the second mount surface 40b. These features are the same as in the fourth embodiment.

In the fifth embodiment, the second laser diode 72 has two light emission points 72a, 72b as shown in FIG. 5B. Laser lights with different wavelengths are emitted from each emission point 72a, 72b. In the second diode 72, two metal wires 55$f_1$, 55$f_2$ are connected to its upper-surface electrode (not shown). The two metal wires 55$f_1$, 55$f_2$ are also connected to the second relay electrode 54b as shown in FIG. 5A. In FIG. 5A, reference numeral 61a indicates an optical axis corresponding to the light emission point 63a of the laser diode 51, and reference numerals 82a, 82b indicate optical axes corresponding to the light emission points 72a, 72b of the laser diode 72.

In the fifth embodiment, the single wavelength laser diode 51 having the one light emission point 63a and the dual wavelength laser diode 72 having the two light emission points 72a, 72b are used. The dual wavelength laser diode 72 may be a dual wavelength laser diode having a light emission point 72a which outputs low-power laser light for DVDs and a light emission point 72b which outputs high-power laser light for CDs, while the single wavelength laser diode 51 may have a light emission point 63a which outputs blue laser light. Thus, the semiconductor laser assembly, according to the fifth embodiment, is producible by changing combinations of the first and second laser diodes 51, 72 to be mounted on the submount 53, and without applying an overload to the production process. The semiconductor laser assembly is capable of generating various laser lights and can easily be produced.

In the fifth embodiment, the two laser diodes 51, 72 are used, but three or more laser diodes may also be mounted on the submount 53. In the first to fifth embodiments, the lead frame type semiconductor laser assemblies have been described, but the semiconductor laser assemblies may also be of metal package type.

The present invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A semiconductor laser assembly comprising:
    a substrate including a first mount surface and a second mount surface;
    a submount mounted on the first mount surface of the substrate;
    a laser diode mounted on the submount and having at least one light emission point and an electrode; and
    a monitoring photodiode mounted on the second mount surface of the substrate and having a light-receiving surface which receives light emitted from the light emission point, and a relay electrode connected to the electrode of the laser diode by a metal wire.

2. The semiconductor laser assembly according to claim 1, wherein a height of the first mount surface in a direction normal to an upper surface of the substrate is higher than that of the second mount surface.

3. The semiconductor laser assembly according to claim 2, wherein, as seen from above, the metal wire is disposed approximately consistent with an optical axis of the laser diode.

4. The semiconductor laser assembly according to claim 1, wherein the light-receiving surface of the monitoring photodiode is located approximately at the same height as or lower than the light emission point of the laser diode.

5. The semiconductor laser assembly according to claim 1, wherein the first and second mount surfaces of the substrate and a laser diode mount surface of the submount are approximately parallel to one another.

6. The semiconductor laser assembly according to claim 5, the laser diode mount surface of the submount is approximately at the same height as the light-receiving surface of the monitoring photodiode.

7. The semiconductor laser assembly according to claim 1, wherein the submount is made of an insulating material having higher heat conductivity than the monitoring photodiode.

8. The semiconductor laser assembly according to claim 1, wherein the submount has a length in a direction of an optical axis of the laser diode that is approximately equal to a resonator length of the laser diode.

9. The semiconductor laser assembly according to claim 1, wherein at least one additional laser diode is mounted on the submount, said additional laser diode also has at least one light emission point and an electrode, and the monitoring photodiode is provided with an additional relay electrode connected to the electrode of said additional laser diode by a metal wire.

10. The semiconductor laser assembly according to claim 1, wherein the laser diode has a plurality of light emission points.

11. The semiconductor laser assembly according to claim 1, wherein two separated metal layers are disposed on the submount, and the laser diode is mounted on the submount through the metal layers in a junction-down manner.

12. The semiconductor laser assembly according to claim 11, wherein the laser diode has two light emission points from which the laser diode emits laser beams with different wavelengths, and electric power is supplied to the laser diode through each of the metal layers, independently of each other so that the two light emission points are controlled independently.

13. The semiconductor laser assembly according to claim 1, wherein the substrate is composed of a metal lead.

14. The semiconductor laser assembly according to claim 1, wherein the relay electrode is connected to an electrode on the substrate by a metal wire.

* * * * *